United States Patent
Higashi et al.

(10) Patent No.: US 8,035,924 B2
(45) Date of Patent: Oct. 11, 2011

(54) SUSPENSION FOR DISC DRIVE (75) Inventors: Tsukasa Higashi, Yokohama (JP);
Hidenori Ogawa, Yokohama (JP)

(73) Assignee: NHK Spring Co., Ltd., Yokohama-Shi (JP)

( * ) Notice: Subject to any disclaimer, the term of this patent is extended or adjusted under 35 U.S.C. 154(b) by 837 days.

(21) Appl. No.: 12/079,622

(22) Filed: Mar. 27, 2008

(65) Prior Publication Data
US 2008/0239576 A1 Oct. 2, 2008

(30) Foreign Application Priority Data
Mar. 30, 2007 (JP) ................................. 2007-094054

(51) Int. Cl.
*G11B 5/60* (2006.01)
*G11B 21/21* (2006.01)

(52) U.S. Cl. ................ 360/245.9; 360/245.8; 360/244.1

(58) Field of Classification Search ............... 360/245.3, 360/245.8, 245.9, 244.1
See application file for complete search history.

(56) References Cited

U.S. PATENT DOCUMENTS

| | | | | |
|---|---|---|---|---|
| 4,703,383 | A * | 10/1987 | Katou et al. ................ 360/123.2 |
| 5,024,722 | A * | 6/1991 | Cathey, Jr. .................... 438/695 |
| 5,065,270 | A * | 11/1991 | Koyanagi et al. ......... 360/123.41 |
| 5,491,597 | A * | 2/1996 | Bennin et al. ............... 360/245.9 |
| 6,046,887 | A | 4/2000 | Uozumi et al. |
| 6,125,015 | A * | 9/2000 | Carlson et al. ............. 360/245.9 |
| 6,185,068 | B1 * | 2/2001 | Fujita et al. .............. 360/123.41 |
| 6,248,252 | B1 * | 6/2001 | Nguyen et al. .................. 216/77 |
| 6,714,384 | B2 * | 3/2004 | Himes et al. ................ 360/245.9 |
| 6,809,415 | B2 * | 10/2004 | Tsukada et al. ................ 257/693 |
| 6,815,126 | B2 * | 11/2004 | Fey et al. .......................... 430/9 |
| 7,009,814 | B2 | 3/2006 | Takikawa et al. |
| 7,336,446 | B2 * | 2/2008 | Kanagawa et al. ......... 360/245.9 |
| 7,382,582 | B1 * | 6/2008 | Cuevas ....................... 360/245.9 |
| 2001/0001587 | A1 * | 5/2001 | Lee et al. .................. 360/245.9 |
| 2003/0188886 | A1 * | 10/2003 | Fey et al. ........................ 174/256 |
| 2005/0124091 | A1 * | 6/2005 | Fukase et al. .................. 438/106 |
| 2006/0268461 | A1 * | 11/2006 | Ogawa et al. .............. 360/244.2 |

(Continued)

FOREIGN PATENT DOCUMENTS

JP 9-128727 A 5/1997

(Continued)

OTHER PUBLICATIONS

Japanese Office Action dated Nov. 9, 2010 (and English translation thereof) in counterpart Japanese Application No. 2007-094054.

(Continued)

*Primary Examiner* — Will J Klimowicz
(74) *Attorney, Agent, or Firm* — Holtz, Holtz, Goodman & Chick, PC (57) ABSTRACT

A suspension for disc drive includes a base plate, a load beam, and a flexure. The flexure includes a metal base member and a circuit member disposed along the metal base member. The circuit member extends in a longitudinal direction of the load beam. The circuit member includes a resin base member formed of an electrically insulating resin and conductors. The conductors are formed into predetermined circuit patterns by etching a deposited copper layer deposited on the resin base member. Each conductor has a cross section in the shape of a trapezoid such that the width of a surface of the conductor which faces the resin base member is greater than that of a surface of the conductor on the side opposite from the resin base member.

9 Claims, 7 Drawing Sheets

U.S. PATENT DOCUMENTS

2007/0041123 A1* 2/2007 Swanson et al. ............. 360/122
2007/0133128 A1* 6/2007 Arai ........................... 360/245.9

FOREIGN PATENT DOCUMENTS

| | | | |
|---|---|---|---|
| JP | 9-128728 A | | 5/1997 |
| JP | 10-270817 A | | 10/1998 |
| JP | 11-39626 A | | 2/1999 |
| JP | 2000040868 A | * | 2/2000 |
| JP | 2000-124580 A | | 4/2000 |
| JP | 2002261407 A | * | 9/2002 |
| JP | 2003-68803 A | | 3/2003 |
| JP | 2004-95076 A | | 3/2004 |
| JP | 2004095749 A | * | 3/2004 |
| JP | 2004-152934 A | | 5/2004 |
| JP | 2006-224571 A | | 8/2006 |
| JP | 2008-076956 A | | 4/2008 |

OTHER PUBLICATIONS

Japanese Office Action dated Mar. 1, 2011 (and English translation thereof) in counterpart Japanese Application No. 2007-094055.

* cited by examiner

SUSPENSION FOR DISC DRIVE

CROSS-REFERENCE TO RELATED APPLICATIONS

This application is based upon and claims the benefit of priority from prior Japanese Patent Application No. 2007-094054, filed Mar. 30, 2007, the entire contents of which are incorporated herein by reference.

BACKGROUND OF THE INVENTION

1. Field of the Invention

The present invention relates to a suspension for disc drive used in an information processing apparatus, such as a personal computer.

2. Description of the Related Art

A hard disc drive (HDD) is used in an information processing apparatus, such as a personal computer. The HDD includes a magnetic disc that rotates around a spindle, a carriage turnable around a pivot, etc. A suspension for disc drive is disposed on an arm of the carriage.

The suspension for disc drive includes a load beam fixed to the carriage, a flexure located overlapping the load beam, etc. A slider is mounted on a tongue portion that is formed on the flexure. The slider is provided with a transducer for reading or writing data.

Flexures of various forms have been put to practical use according to required specifications. As an example of these flexures, there is a flexure with conductors described in Jpn. Pat. Appln. KOKAI Publication No. 9-128727 or 9-128728. The flexure with conductors include a metal base member formed of a thin stainless steel plate, a resin base member formed of an electrically insulating material, such as polyimide, a plurality of copper conductors, etc. The resin base member is formed on the metal base member. The conductors are formed on the resin base member.

Figure 12:
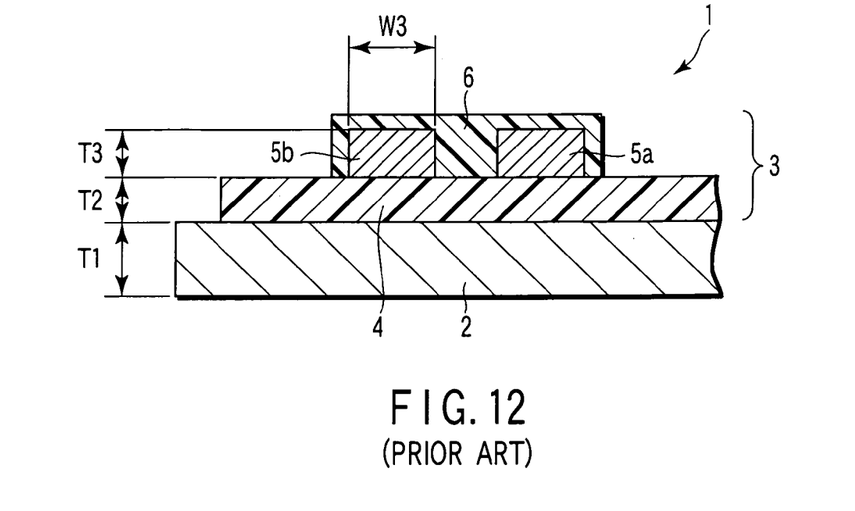
FIG. 12 is a sectional view showing a portion in which a metal base member and a circuit member of a conventional flexure overlap each other.

FIG. 12 shows a part of a conventional flexure 1 with conductors. The flexure 1 includes a metal base member 2 and a circuit member 3 formed thereon. The circuit member 3 includes a resin base member 4 formed of polyimide for example, conductors 5a and 5b formed of copper, a resin cover member 6, etc. In manufacturing the flexure 1 with conductors, resist films (not shown) corresponding to circuit patterns are formed on the resin base member 4. Further, the conductors 5a and 5b are formed by electrodepositing copper on that part of the surface of the resin base member 4 which is not covered by the resist film.

Figure 13:
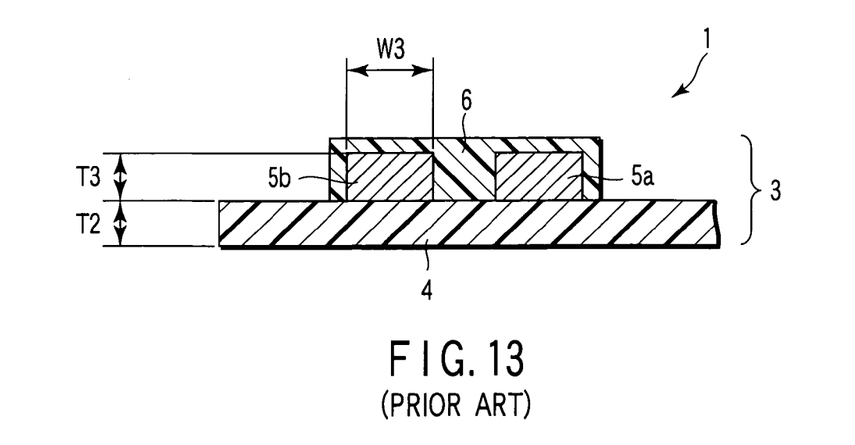
FIG. 13 is a sectional view showing a portion of the conventional flexure formed of the circuit member only.

The conductors 5a and 5b are individually deposited between the resist films on the resin base member 4. Thus, the cross section of each of the conductors 5a and 5b is rectangular. Thus, the upper and lower surfaces of each of the conductors 5a and 5b share a width W3 in common. As shown in FIG. 13, moreover, portions that are provided with the circuit member 3 only are formed by removing a part of the metal base member 2 by etching. Also in this case, each of the conductors 5a and 5b has a rectangular cross section.

A bending stress may act in the thickness direction in some flexures with a circuit member. In these flexures, the peel strength of the conductors on the resin base member is expected to be enhanced. However, the peel strength of the conventional conductors against bending can be enhanced only limitedly.

Possibly, the conductors may be disposed on the resin base member by laminating thin rolled copper sheets on the resin base member. However, rolled copper contains a certain percentage of additional elements (e.g., several percent or less of nickel, silicon, etc.). Since rolled copper is lower in electrical conductivity than deposited copper (pure copper), therefore, it may fail to deal with high-speed transfer of read or write signals. In addition, the bending stiffness of rolled copper is higher than that of deposited copper. Thus, if the circuit member with the conductors formed of rolled copper bends in its thickness direction, its spring characteristics may possibly adversely affect the roll or pitch static attitude of the slider.

BRIEF SUMMARY OF THE INVENTION

The object of the present invention is to provide a suspension for disc drive, relatively low in bending stiffness and including a circuit member with high electrical conductivity and conductors with high peel strength.

The present invention is a suspension for disc drive, which comprises a base plate, a load beam, and a flexure which is disposed along the load beam and includes a slider on a distal end thereof. In this suspension, the flexure includes a metal base member and a circuit member which is disposed along the metal base member, extends in a longitudinal direction of the load beam, and is electrically connected to the slider. The circuit member includes a resin base member formed of an electrically insulating resin and conductors of predetermined circuit patterns formed by etching a deposited copper layer deposited on the resin base member. Each of the conductors has a cross section in the shape of a trapezoid such that the width of a surface of the conductor which faces the resin base member is greater than that of a surface of the conductor on the side opposite from the resin base member.

The circuit member of the flexure includes the resin base member and the conductors formed on the resin base member. These conductors are formed into the predetermined patterns by etching the deposited copper layer on the resin base member. Since the cross section of each conductor is trapezoidal, the peel strength of the conductors is enhanced, and the bending stiffness can be reduced. The electrical conductivity of the conductors formed of deposited copper can be made higher than conductors formed of rolled copper.

According to an aspect of the invention, a spring portion bendable in a thickness direction thereof is disposed between the base plate and the load beam, and a part of the flexure is located side by side with the spring portion so as to dridge the base plate and the load beam. Alternatively, a part of the load beam may be provided with a spring portion bendable in a thickness direction thereof, and a part of the flexure may be located side by side with the spring portion. In these aspects, the flexure partially bends in the vicinity of the spring portion when the spring portion bends.

According to another aspect of the invention, the flexure may include a portion in which the metal base member and the circuit member overlap each other and a portion formed of the circuit member only. Alternatively, the portion formed of the circuit member only is formed in that region of the flexure which extends along the slider. Alternatively, moreover, a part of the flexure may be formed with a conductor-only portion which includes neither the metal base member nor the resin base member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A suspension for disc drive according to a first embodiment of the present invention will now be described with reference to FIGS. 1 to 10.

Figure 1:
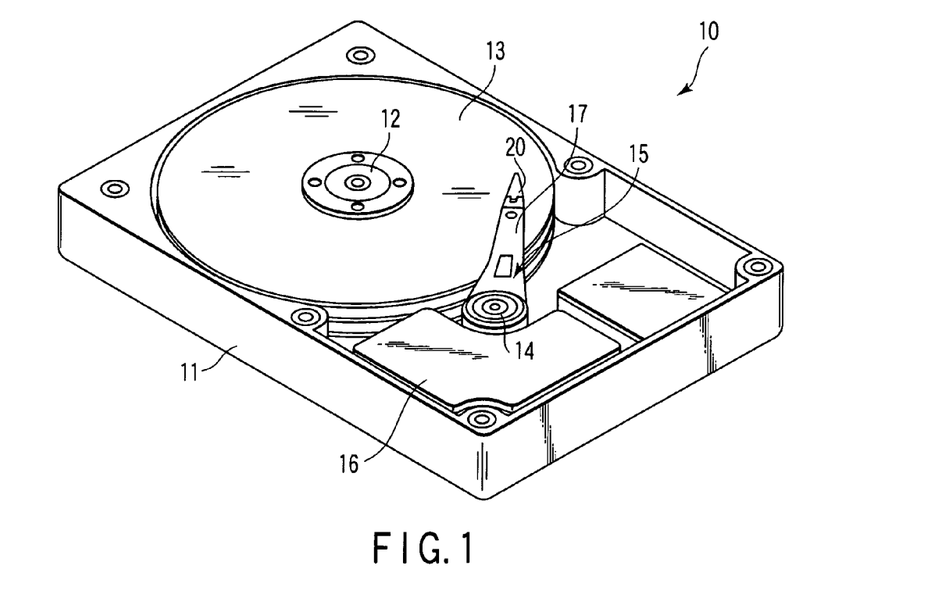
FIG. 1 is a perspective view of a disc drive provided with a suspension according to a first embodiment of the invention.

A hard disc drive (HDD) 10 shown in FIG. 1 includes a case 11, discs 13, a carriage 15, a positioning motor 16, etc. The discs 13 rotate around a spindle 12. The carriage 15 is tunable around a pivot 14. The positioning motor 16 drives the carriage 15. The case 11 is covered by a lid (not shown).

Figure 2:
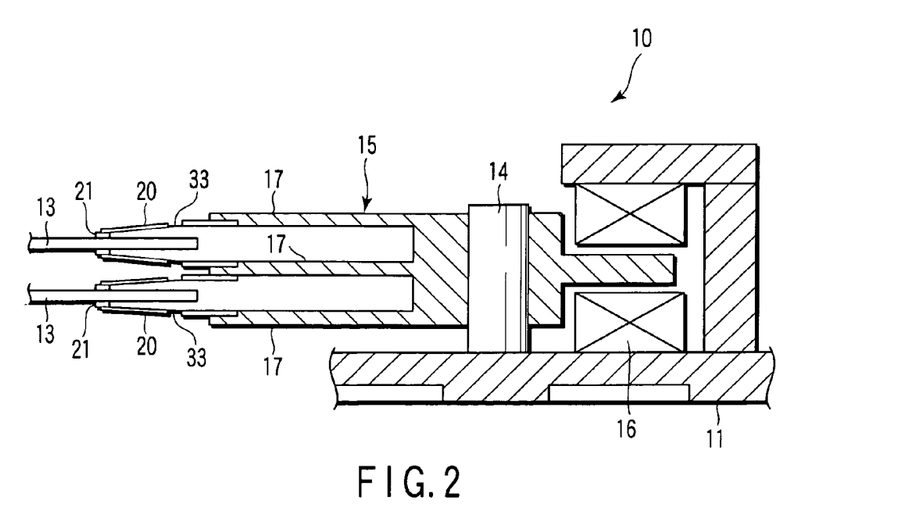
FIG. 2 is a sectional view of a part of the disc drive shown in FIG. 1.

FIG. 2 is a sectional view schematically showing a part of the disc drive 10. As shown in FIG. 2, the carriage 15 is provided with arms 17. A suspension 20 is attached to the distal end portion of each arm 17. A slider 21 that forms a magnetic head is disposed on the distal end of the suspension 20. When each disc 13 rotates at high speed, an air bearing is formed between the disc 13 and the slider 21. When the carriage 15 is turned by the positioning motor 16, the suspension 20 moves in the radial direction of the disc 13, whereupon the slider 21 moves to a position corresponding to a desired track of the disc 13.

Figure 3:
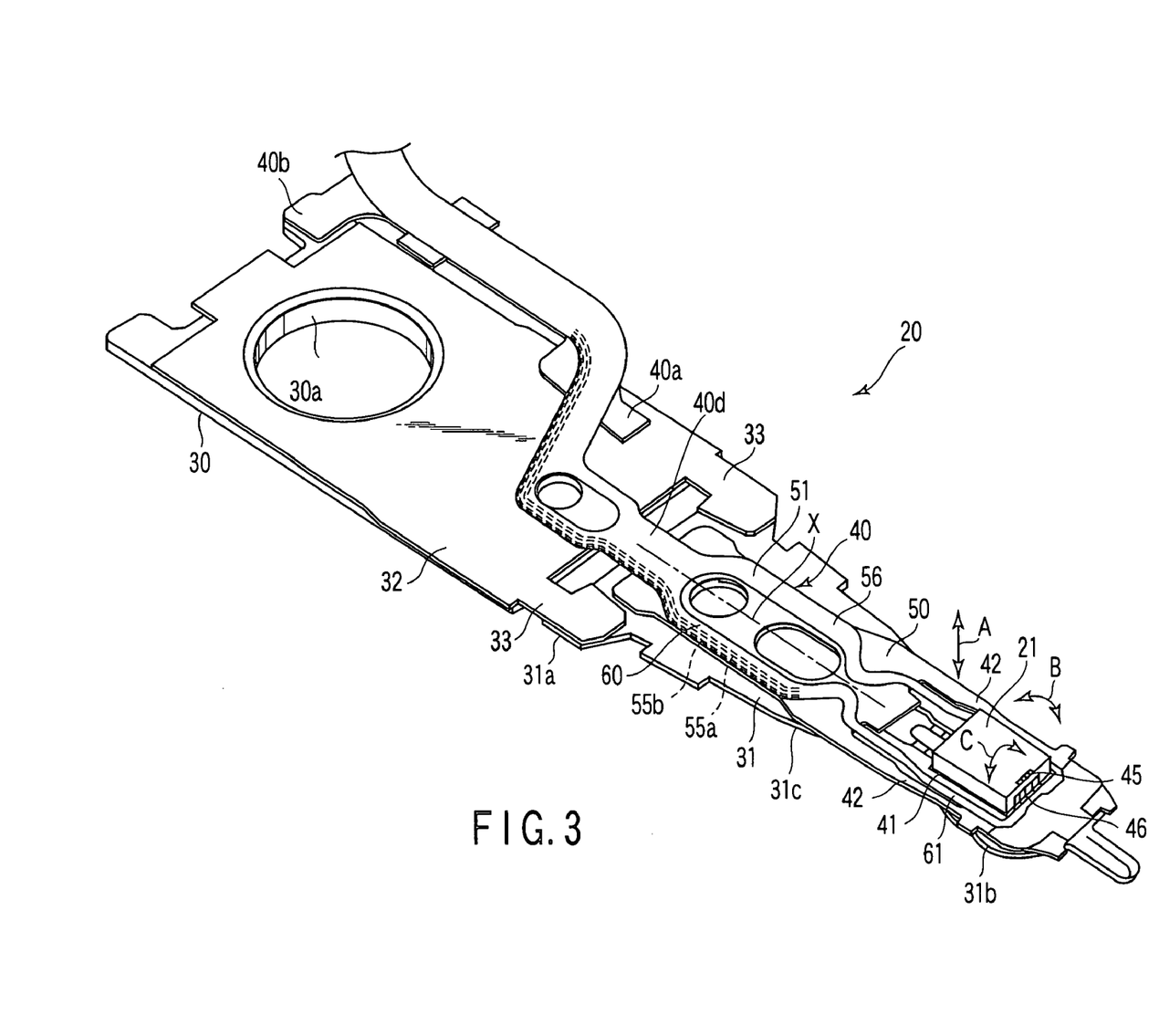
FIG. 3 is a perspective view of the suspension used in the disc drive of FIG. 1.

FIG. 3 shows an example of the suspension 20. This suspension 20 is provided with a base plate 30, a load beam 31, a hinge member 32 formed of a thin plate spring, a flexure 40 with conductors, etc. A boss portion 30a of the base plate 30 is fixed to the arm 17 of the carriage 15.

The load beam 31 includes a base portion 31a fixed to the hinge member 32, a tip portion 31b situated near the slider 21, a longitudinally intermediate portion 31c of the load beam 31, etc. The hinge member 32 is provided with a pair of spring portions 33. The spring portions 33 are formed between the base plate 30 and the load beam 31. The spring portions 33 are bendable in their thickness direction. The load beam 31 can elastically shift its position in the direction indicated by arrow A in FIG. 3 around a region near the spring portions 33, with respect to the base plate 30 on the fixed side.

The flexure 40 extends in a direction along an axis X (shown in FIG. 3) of the load beam 31. In other words, the flexure 40 extends in the longitudinal direction of the load beam 31. A part of the flexure 40 overlaps the load beam 31 and is fixed to the beam 31 by fixing means, such as laser welding. A portion 40a of the flexure 40 that is situated near the base plate 30 is fixed to the hinge member 32. A rear portion 40b of the flexure 40 is fixed to the base plate 30. Depending on the type of suspension, the rear portion of the flexure 40 may not be fixed to the base plate 30.

Figure 4:
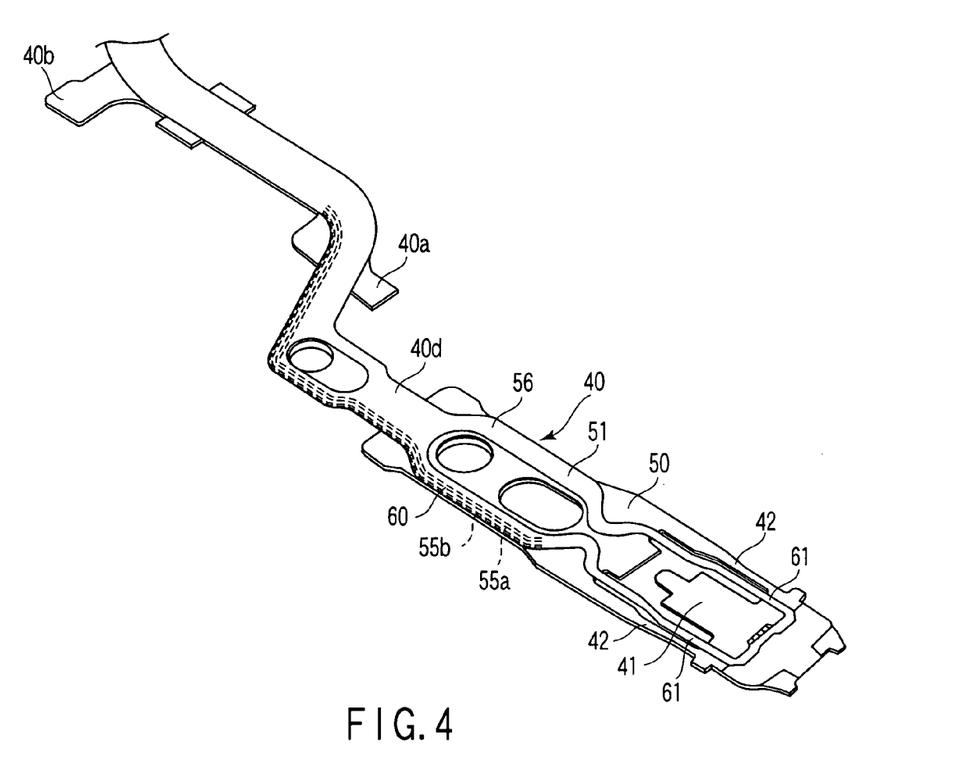
FIG. 4 is a perspective view of a flexure of the suspension shown in FIG. 3.

FIG. 4 is a perspective view of the flexure 40. A tongue portion (gimbals portion) 41 and a pair of outrigger portions 42 are disposed near the distal end of the flexure 40. The outrigger portions 42 are situated individually on the opposite sides of the tongue portion 41. The slider 21 (shown in FIG. 3) is mounted on the tongue portion 41. The slider 21, which functions as the magnetic head, is provided with a transducer portion 45 (shown in FIG. 3), a pad portion 46, etc. The transducer portion 45 is provided with read elements and write elements. The pad portion 46 functions as a connection terminal.

Figure 5:
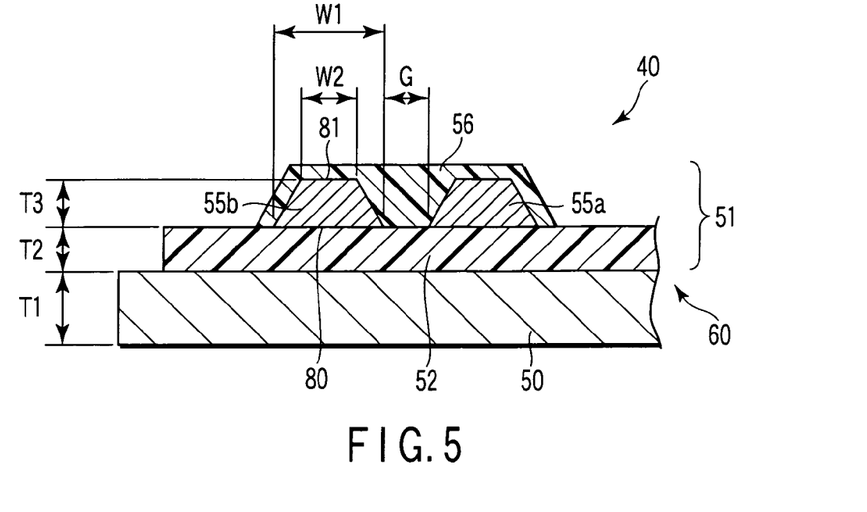
FIG. 5 is a sectional view schematically showing a part of the flexure shown in FIG. 4.

FIG. 5 schematically shows a cross section of a part of the flexure 40 in the thickness direction. The flexure 40 includes a metal base member 50 and a circuit member 51. The metal base member 50 is formed of a thin, elastic stainless steel plate.

The circuit member 51 is formed along the metal base member 50. The circuit member 51 is composed of a resin base member 52, a plurality of conductors 55a and 55b (only two are shown as representatives), a resin cover member 56, etc. The resin base member 52 is formed of an electrically insulating material, such as polyimide. The conductors 55a and 55b are formed on the resin base member 52. The resin cover member 56 is formed of an electrically insulating material, e.g., a high-polymer material such as polyimide. The conductors 55a and 55b are covered by the resin cover member 56.

Although only the two conductors 55a and 55b are illustrated, the flexure 40 according to the present embodiment is also provided with other conductors (not shown). The conductors may, for example, be a pair of conductors for data reading, a pair of conductors for data writing, heater conductors formed as required, etc.

The conductors 55a and 55b are made of deposited copper. They are formed on the resin base member 52 by a manufacturing method mentioned later. Each of the conductors 55a and 55b is formed by etching into a desired circuit pattern along the longitudinal direction of the flexure 40. In FIGS. 3 and 4, the respective circuit patterns of the conductors 55a and 55b are partially indicated by broken lines. The respective distal ends of the conductors 55a and 55b are connected to the pad portion 46 of the slider 21. The other ends of the conductors 55a and 55b are connected to an amplifier of the disc drive 10 through a terminal area (not shown).

Figure 6:
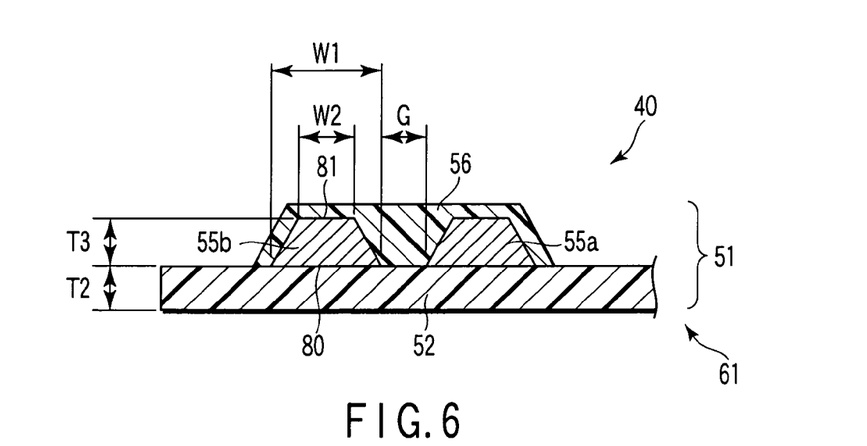
FIG. 6 is a sectional view schematically showing another part of the flexure of FIG. 4.

As shown in FIG. 5, the flexure 40 includes a portion 60 in which the metal base member 50 and the circuit member 51 overlap each other. As shown in FIG. 6, moreover, the flexure 40 includes circuit-member-only portions 61 (without the metal base member 50) that are provided with the circuit member 51 only. As shown in FIG. 3, for example, the portions 61 are formed in those regions of the entire flexure 40 which are situated near the slider 21 and extend individually along side faces of the slider 21. Thus, the circuit-member-only portions 61 are formed individually along the outrigger portions 42. The portions 61 are formed by removing a part of the metal base member 50 by etching.

The circuit-member-only portions 61 are not overlapped by the metal base member 50. Therefore, the bending stiffness of the portions 61 is lower than that of the portion 60 in which the metal base member 50 and the circuit member 51 overlap each other. Thus, the portions 61 generate only a small repulsive force when they bend. Since the circuit-member-only portions 61 are located near the slider 21, the influence of a deflection of the circuit member 51 on the pitch and roll stiffness of the slider 21 can be reduced. Thus, the orientation of the slider 21 can be accurately controlled. The pitch stiffness is in the direction indicated by arrow B in FIG. 3, while the roll stiffness is in the direction indicated by arrow C.

Figure 7:
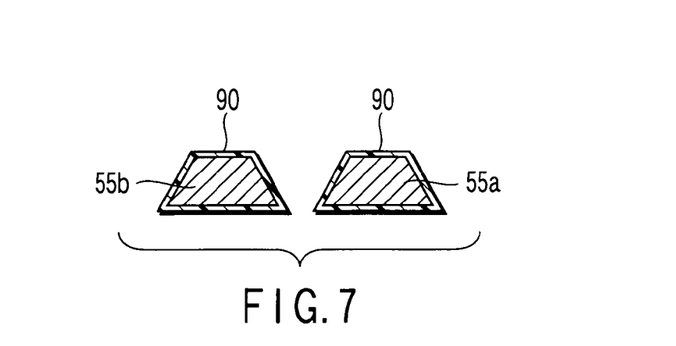
FIG. 7 is a sectional view showing a portion of the flexure of FIG. 4 formed of conductors only.

As shown in FIG. 7, a portion may be formed with the conductors 55a and 55b only. Specifically, the bending stiffness can be further reduced by forming in a part of the flexure 40 a portion that is free from the metal base member 50 and the resin base member 52. A plating layer 90 may be formed on the surface of each of the conductors 55a and 55b. The plating layer 90 is formed of a gold deposit or a combination of nickel and gold deposits.

In the present embodiment, the pair of spring portions 33 that are bendable in the thickness direction are formed between the base plate 30 and the load beam 31. A part 40d of the flexure 40 is located between and side by side with the spring portions 33. The part 40d bridges the base plate 30 and the load beam 31.

The manufacturing method for the flexure 40 of the present embodiment will now be described with reference to FIGS. 8 to 10.

Figure 8:
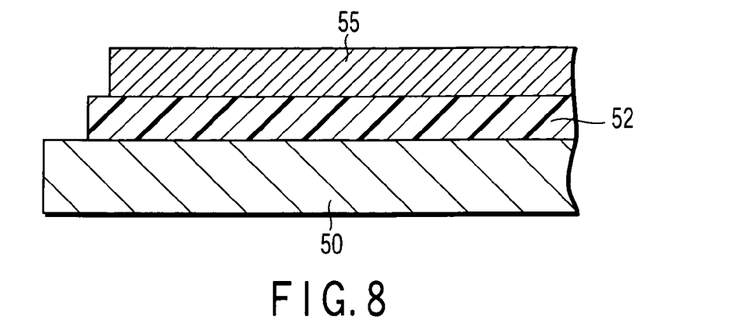
FIG. 8 is a sectional view schematically showing a metal base member, a resin base member, and a deposited copper layer.

As shown in FIG. 8, the resin base member 52 of polyimide is formed on the metal base member 50 of stainless steel. The resin base member 52 is formed by laminating a polyimide plate on the metal base member 50 or by applying liquid polyimide to the surface of the metal base member 50 and then curing it.

After the resin base member 52 is heat-treated, a seed layer (not shown) for copper plating is formed on its surface by sputtering or any other film forming method. Pure copper (deposited copper) is deposited on the seed layer by a copper plating process. By this copper plating, a deposited copper layer 55 with a uniform thickness is formed substantially on the entire surface of the resin base member 52, as shown in FIG. 8.

Figure 9:
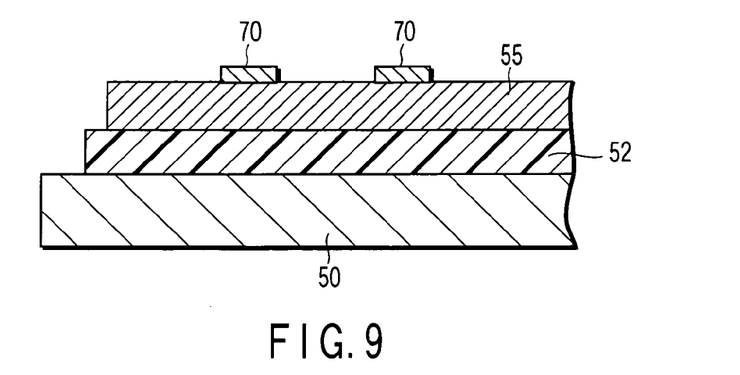
FIG. 9 is a sectional view showing a state in which resist films are formed on the deposited copper layer shown in FIG. 7.
Figure 10:
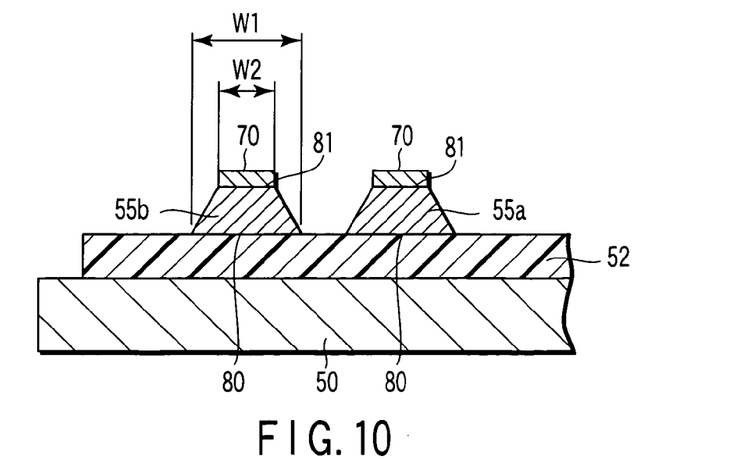
FIG. 10 is a sectional view showing the deposited copper layer of FIG. 7 in an etched state.

As shown in FIG. 9, resist films 70 corresponding to the circuit patterns are formed on the surface of the deposited copper layer 55. Thereafter, that part of the surface of the deposited copper layer 55 which is not covered by the resist films 70 is removed by etching, as shown in FIG. 10.

As that part of the deposited copper layer 55 which is not covered by the resist films 70 is removed by the etching, the conductors 55a and 55b of the predetermined circuit patterns corresponding to the patterns of the resist films 70 are formed. Thereafter, the resist films 70 are removed.

Further, the flexure 40 with a predetermined shape is formed by partially removing the metal base member 50 and the resin base member 52 by etching as required. The circuit-member-only portions 61 shown in FIG. 6 are formed by removing a part of the metal base member 50, for example. If necessary, moreover, the conductors 55a and 55b are plated with nickel or gold. If necessary, furthermore, a resin cover 56 is formed on the conductors 55a and 55b.

In the present embodiment, as shown in FIG. 8, the deposited copper layer 55 is simultaneously formed substantially on the entire surface of the resin base member 52, as shown in FIG. 8. Therefore, an electric current of uniform density can be supplied to the deposited copper layer 55, so that the current density for plating varies little. Thus, the thickness of the deposited copper layer 55 varies so little that the variation of the thickness of the conductors 55a and 55b can be reduced in the end.

The predetermined circuit patterns of the conductors 55a and 55b of the present embodiment can be obtained by etching the deposited copper layer 55 that is uniformly formed on the entire surface of the resin base member 52. Each of the conductors 55a and 55b is formed so that its cross section is trapezoidal, as shown in FIG. 10, by adjusting the time of contact with an etching solution, etc.

In the cross section of each of the conductors 55a and 55b, a width W1 of a surface 80 that faces the resin base member 52 is greater than a width W2 of a surface 81 on the side opposite from the resin base member 52. Thus, the area of contact between the resin base member 52 and the conductors 55a and 55b is greater than that between the conventional resin base member 4 and the conductors 5a and 5b shown in FIG. 12.

For example, the width W1 of the lower base of each of the conductors 55a and 55b shown in FIG. 5 is 0.025 mm, and the width W2 of the upper base is 0.015 mm. The width W3 of each of the conductors 5a and 5b shown in FIG. 12 is 0.020 mm. In this case, the area of contact between the resin base member 52 and the conductors 55a and 55b shown in FIG. 5 is 25% greater than that between the resin base member 4 and the conductors 5a and 5b shown in FIG. 12. Thus, the peel strength of the conductors 55a and 55b of the present embodiment can be made higher than that of the conventional conductors 5a and 5b (FIG. 12).

Accordingly, the conductors 55a and 55b cannot easily exfoliate in the region where the circuit member 51 bends in the thickness direction. In the region near the spring portions 33 of the hinge member 32, for example, the circuit member 51 bends in the thickness direction. Since the peel strength of the conductors 55a and 55b is thus high in the region where the circuit member 51 bends in the thickness direction, the conductors 55a and 55b can be prevented from being separated from the resin base member 52. In addition, since the peel strength of the conductors 55a and 55b is high, the conductors 55a and 55b can be prevented from being separated when they contact a machining tool or transportation system in a manufacturing process for the suspension 20.

The following is a description of the bending stiffness of the circuit member 51.

The bending stiffness of the flexure 40 shown in FIGS. 5 and 6 was compared with that of the conventional flexure 1 shown in FIGS. 12 and 13 under the following conditions. The number of conductors is two in either case.

In the case shown in FIGS. 5 and 6, the widths W1 and W2 of the lower and upper bases of each of the conductors 55a and 55b are 0.025 mm and 0.015 mm, respectively. A distance G between the conductors 55a and 55b ranges from 0.015 to 0.025 mm. A thickness T1 of the metal base member 50 is 0.020 mm, a thickness T2 of the resin base member 52 is 0.010 mm, and a thickness T3 of each of the conductors 55a and 55b is 0.012 mm. The width of either of the metal and resin base members 50 and 52 is 0.08 mm.

The elastic modulus of the conductors 55a and 55b is 46 GPa, while those of the resin and metal base members 52 and 50 are 7.5 MPa and 180 GPa, respectively. An equivalent bending stiffness EI can be represented by $\Sigma E_i I_i$, where $I_i$ is the geometrical moment of inertia of each of the metal and resin base members 50 and 52 and the conductors 55a and 55b with respect a neutral axis, and $E_i$ is the elastic modulus of each.

In the conventional flexure 1 shown in FIGS. 12 and 13, the width W3 of each of the rectangular-profiled conductors 5a and 5b with is 0.020 mm. Other conditions of the flexure 1 are the same as those of the one shown in FIGS. 5 and 6. Thus, the cross-sectional area of each of the conductors 55a and 55b of FIGS. 5 and 6 is equal to that of each of the conductors 5a and 5b of FIGS. 12 and 13.

According to the present embodiment, the bending stiffness of the portion 60 in which the metal base member 50 and the circuit member 51 overlap each other, as shown in FIG. 5, can be made 1.8% lower than that of the conventional flexure 1 shown in FIG. 12.

The bending stiffness of the circuit-member-only portions 61 of the present embodiment shown in FIG. 6 can be made 6.3% lower than that of the conventional flexure 1 shown in FIG. 13. Since the stiffness of the circuit member 51 can be reduced, the vibration characteristics of the suspension 20 can be improved. In the regions along the slider 21, in particular, a synergistic effect is obtained by providing the circuit member 51 only, as shown in FIG. 6, so that the influence on the pitch and roll stiffness of the tongue portion 41 can be reduced.

As mentioned before, the conductors 55a and 55b of the present embodiment are made of deposited copper. Since deposited copper is higher than rolled copper in purity and electrical conductivity, it can deal with high-speed signal transfer. Further, the thickness of the conductors 55a and 55b of deposited copper can be freely set according to required specifications.

The conductors 55a and 55b are formed by etching the deposited copper layer 55 that is deposited on the resin base member 52. Therefore, the thickness of the conductors 55a and 55b can be made smaller than that of the conductors that are formed by laminating rolled copper sheets. In addition, the width of and the distance between the conductors 55a and 55b can be reduced. Thus, necessary spaces for the arrangement of the conductors 55a and 55b can be reduced, that is, a large number of conductors can be arranged in regions of limited areas.

Figure 11:
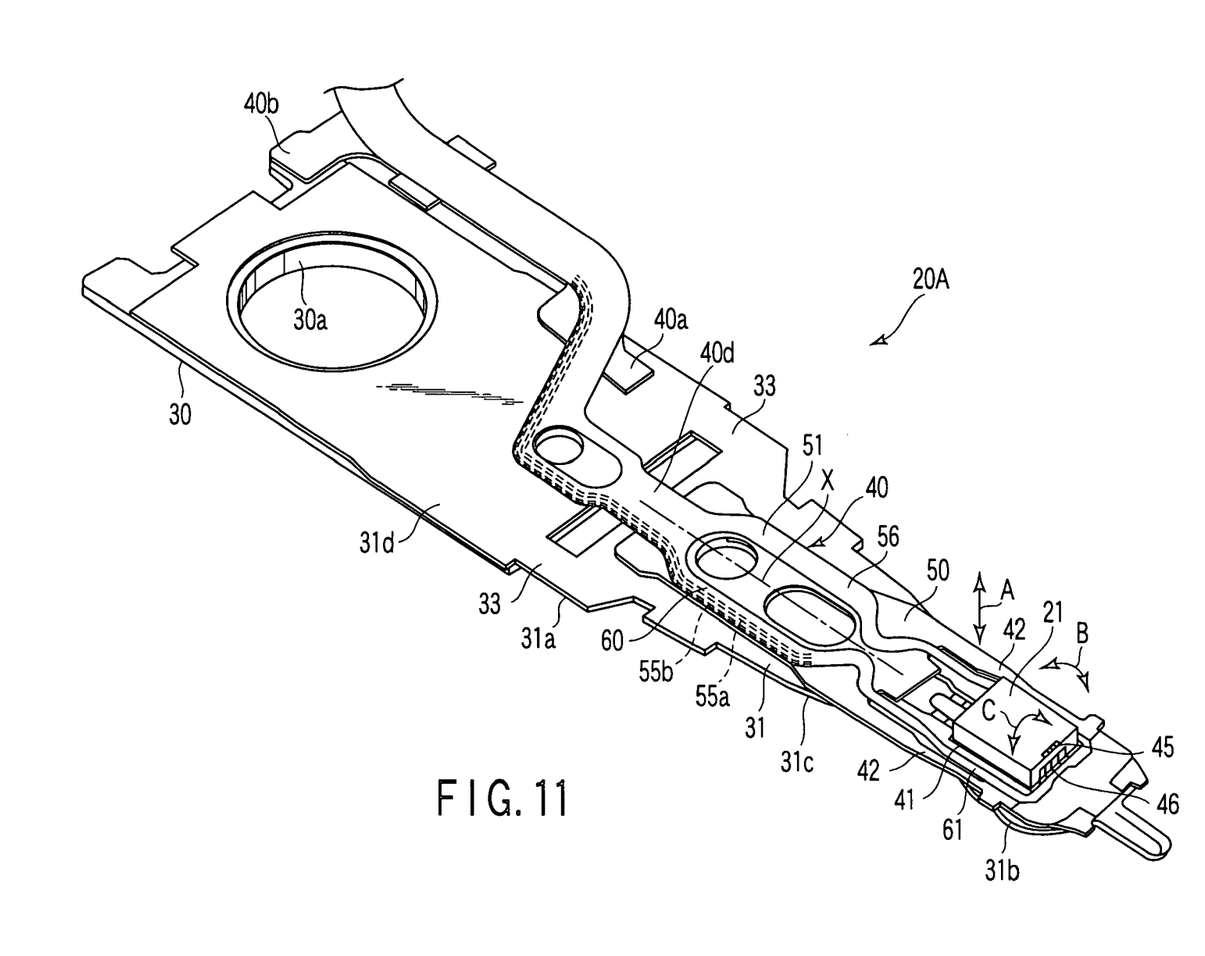
FIG. 11 is a perspective view of a suspension according to a second embodiment of the invention.

FIG. 11 shows a suspension 20A for disc drive according to a second embodiment of the present invention. A rear portion 31d of a load beam 31 of this suspension 20A extends toward a base plate 30 and is fixed to the base plate in an overlapping manner. The suspension 20A is not provided with the hinge member 32. In this second embodiment, spring portions 33 are formed on a part of the load beam 31. The spring portions 33 are springy bendable in the thickness direction. Since other configurations and functions are common to the suspensions 20 and 20A of the first and second embodiments, common numerals are used to designate common portions, and a description of those portions is omitted.

It is to be understood, in carrying out the invention, that its components, including the metal base member, circuit member, resin base member, conductors, etc., as well as the base plate, load beam and flexure, may be embodied in modified forms without departing from the scope or spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A suspension for disc drive, comprising:
a base plate;
a load beam; and
a flexure which is disposed along the load beam and includes a slider on a distal end portion thereof,
wherein the flexure includes a metal base member and a circuit member which is disposed along the metal base member, extends in a longitudinal direction of the load beam, and is electrically connected to the slider,
wherein the circuit member includes: (i) a resin base member comprising an electrically insulating resin, the resin base member being formed on the metal base member, (ii) at least a pair of conductors of predetermined circuit patterns comprising a copper layer deposited on the resin base member, and (iii) a resin cover member which covers the conductors,
wherein each of the conductors has a trapezoid shape in cross section such that a width of a first surface of the conductor which faces the resin base member is greater than a width of a second surface of the conductor on a side opposite from the resin base member, and
wherein the resin cover member comprises a pair of side surfaces extending along each side surface of the conductors, a flat surface formed between the pair of side surfaces of the resin cover member, the flat surface extending along the second surface of the conductor, and an inverted trapezoid resin portion having an inverted trapezoid shape in cross section, the inverted trapezoid resin portion being filled between the pair of conductors.

2. A suspension for disc drive according to claim 1, wherein a spring portion bendable in a thickness direction thereof is disposed between the base plate and the load beam, and a part of the flexure is located side by side with the spring portion so as to bridge the base plate and the load beam.

3. A suspension for disc drive according to claim 2, wherein the flexure includes a portion in which the metal base member and the circuit member overlap each other and a portion formed of the circuit member only.

4. A suspension for disc drive according to claim 3, wherein the portion formed of the circuit member only is formed in a region of the flexure which extends along the slider.

5. A suspension for disc drive according to claim 1, wherein a part of the load beam is provided with a spring portion bendable in a thickness direction thereof, and a part of the flexure is located side by side with the spring portion.

6. A suspension for disc drive according to claim 5, wherein the flexure includes a portion in which the metal base member and the circuit member overlap each other and a portion formed of the circuit member only.

7. A suspension for disc drive according to claim 6, wherein the portion formed of the circuit member only is formed in a region of the flexure which extends along the slider.

8. A suspension for disc drive according to claim 1, wherein the flexure includes a portion in which the metal base member and the circuit member overlap each other and a portion formed of the circuit member only.

9. A suspension for disc drive according to claim 8, wherein the portion formed of the circuit member only is formed in a region of the flexure which extends along the slider.

* * * * *